US008263539B2

(12) United States Patent
Phenis et al.

(10) Patent No.: US 8,263,539 B2
(45) Date of Patent: Sep. 11, 2012

(54) DYNAMIC MULTI-PURPOSE COMPOSITION FOR THE REMOVAL OF PHOTORESISTS AND METHODS FOR ITS USE

(75) Inventors: Michael T. Phenis, Markleville, IN (US); Diane Marie Scheele, Greenwood, IN (US); Kimberly Dona Pollard, Anderson, IN (US)

(73) Assignee: Dynaloy, LLC, Kingsport, TN (US)

( * ) Notice: Subject to any disclaimer, the term of this patent is extended or adjusted under 35 U.S.C. 154(b) by 1112 days.

(21) Appl. No.: 11/551,826

(22) Filed: Oct. 23, 2006

(65) Prior Publication Data

US 2007/0111912 A1    May 17, 2007

Related U.S. Application Data

(63) Continuation-in-part of application No. 11/260,912, filed on Oct. 28, 2005, now Pat. No. 7,632,796.

(51) Int. Cl.
*C11D 7/32*    (2006.01)
(52) U.S. Cl. .......................... 510/176; 216/83
(58) Field of Classification Search ............... None
See application file for complete search history.

(56) References Cited

U.S. PATENT DOCUMENTS

| 3,562,038 | A | 2/1971 | Shipley et al. |
| 3,673,099 | A | 6/1972 | Corby et al. |
| 4,787,997 | A | 11/1988 | Saito et al. |
| 5,304,284 | A | 4/1994 | Jagannathan et al. |
| 5,308,745 | A | 5/1994 | Schwartzkopf |
| 5,419,779 | A | 3/1995 | Ward |
| 5,417,877 | A | 5/1995 | Ward |
| 5,422,309 | A | 6/1995 | Zettler et al. |
| 5,468,423 | A | 11/1995 | Garabedian, Jr. et al. |
| 5,597,678 | A | 1/1997 | Honda et al. |
| 5,612,304 | A | 3/1997 | Honda et al. |
| 5,648,324 | A | 7/1997 | Honda et al. |
| 5,795,702 | A | 8/1998 | Tanabe et al. |
| 5,798,323 | A | 8/1998 | Honda et al. |
| 5,840,622 | A | 11/1998 | Miles et al. |
| 5,928,430 | A | 7/1999 | Ward et al. |
| 6,033,996 | A | 3/2000 | Rath et al. |
| 6,200,891 | B1 | 3/2001 | Jagannathan et al. |
| 6,276,372 | B1 | 8/2001 | Lee |
| 6,319,835 | B1 | 11/2001 | Sahbari et al. |
| 6,372,410 | B1 | 4/2002 | Ikemoto et al. |
| 6,455,479 | B1 | 9/2002 | Sahbari |
| 6,465,403 | B1 | 10/2002 | Skee |
| 6,482,656 | B1 | 11/2002 | Lopatin |
| 6,531,436 | B1 | 3/2003 | Sahbari et al. |
| 6,579,668 | B1 | 6/2003 | Baik et al. |
| 6,638,694 | B2 | 10/2003 | Ikemoto et al. |
| 6,777,380 | B2 | 8/2004 | Small et al. |
| 6,825,156 | B2 | 11/2004 | Lee et al. |
| 6,846,748 | B2 | 1/2005 | Chien et al. |
| 6,872,663 | B1 | 3/2005 | Okada |
| 6,878,500 | B2 | 4/2005 | Rutter, Jr. et al. |
| 6,916,772 | B2 | 7/2005 | Zhou et al. |
| 7,049,275 | B2 | 5/2006 | Ikemoto et al. |
| 7,064,087 | B1 | 6/2006 | Turner et al. |
| 7,144,848 | B2 * | 12/2006 | Zhou et al. ........... 510/175 |
| 7,528,098 | B2 * | 5/2009 | Lee et al. ............. 510/175 |
| 7,543,592 | B2 * | 6/2009 | Lee .......................... 134/1.3 |
| 7,579,308 | B2 * | 8/2009 | Lee .......................... 510/175 |
| 7,632,796 | B2 * | 12/2009 | Phenis et al. ......... 510/175 |
| 2001/0014534 | A1 | 8/2001 | Aoki et al. |
| 2002/0037819 | A1 | 3/2002 | Sahbari |
| 2002/0128164 | A1 | 9/2002 | Hara et al. |
| 2002/0152925 | A1 | 10/2002 | Soutar et al. |
| 2003/0130149 | A1 | 7/2003 | Zhou et al. |
| 2003/0138737 | A1 | 7/2003 | Wakiya et al. |
| 2003/0181344 | A1 | 9/2003 | Ikemoto et al. |
| 2003/0186175 | A1 | 10/2003 | Ikemoto et al. |
| 2003/0194636 | A1 | 10/2003 | Wanat et al. |
| 2003/0228990 | A1 * | 12/2003 | Lee et al. ............. 510/202 |
| 2004/0038840 | A1 | 2/2004 | Lee et al. |
| 2004/0048761 | A1 | 3/2004 | Ikemoto |
| 2004/0081922 | A1 | 4/2004 | Ikemoto et al. |
| 2004/0106532 | A1 | 6/2004 | Yokoi et al. |
| 2004/0134873 | A1 | 7/2004 | Yao et al. |
| 2004/0147420 | A1 * | 7/2004 | Zhou et al. ........... 510/176 |
| 2004/0256358 | A1 | 12/2004 | Shimizu et al. |
| 2005/0016961 | A1 | 1/2005 | Toda et al. |
| 2005/0090416 | A1 * | 4/2005 | Lee et al. ............. 510/175 |
| 2005/0176259 | A1 | 8/2005 | Yokoi et al. |
| 2005/0202987 | A1 | 9/2005 | Small et al. |
| 2005/0263743 | A1 * | 12/2005 | Lee .......................... 252/364 |

(Continued)

FOREIGN PATENT DOCUMENTS

EP    0 678 571 A    10/1995

(Continued)

OTHER PUBLICATIONS

Patent Application Search Report mailed on Jun. 5, 2008.
International Search Report, PCT/US2007/066128, issued Feb. 21, 2008.
Ho et al., Wafer-Scale, Sub-5 nm Junction Formation by Monolayer Doping and Conventional Spike Annealing, Nano Letters, 2009, vol. 9, No. 2, pp. 725-730, entire document, especially: p. 726, col. 1, para. 2.
Ho et al., Controlled Nanoscale Doping of Semiconductors via Molecular Monolayers, Nature Materials, vol. 7, Jan. 2008, pp. 62-67, entire document.
"Resorcinol CAS# 108-46-3", IS Chemical Technology, 2010.
Database WPI Week 199424, Derwent Publications Ltd., London.
Notification of Transmittal of the International Search Report dated Feb. 21, 2008 for corresponding PCT/US2007/066128.

(Continued)

*Primary Examiner* — Allan Olsen
(74) *Attorney, Agent, or Firm* — Dennis V. Carmen

(57) ABSTRACT

Improved dry stripper solutions for removing one, two or more photoresist layers from substrates are provided. The stripper solutions comprise dimethyl sulfoxide, a quaternary ammonium hydroxide, and an alkanolamine, an optional secondary solvent and less than about 3 wt. % water and/or a dryness coefficient of at least about 1. Methods for the preparation and use of the improved dry stripping solutions are additionally provided.

20 Claims, No Drawings

U.S. PATENT DOCUMENTS

| | | | |
|---|---|---|---|
| 2006/0003910 A1 | 1/2006 | Hsu et al. | |
| 2006/0014656 A1 | 1/2006 | Egbe et al. | |
| 2006/0046446 A1 | 3/2006 | Kon et al. | |
| 2006/0073997 A1 | 4/2006 | Leonte et al. | |
| 2006/0094613 A1* | 5/2006 | Lee | 510/175 |
| 2006/0099831 A1 | 5/2006 | Borovik et al. | |
| 2006/0138399 A1 | 6/2006 | Itano et al. | |
| 2007/0099805 A1* | 5/2007 | Phenis et al. | 510/175 |
| 2007/0111912 A1* | 5/2007 | Phenis et al. | 510/175 |
| 2007/0149430 A1 | 6/2007 | Egbe et al. | |
| 2007/0243773 A1* | 10/2007 | Phenis et al. | 439/892 |
| 2008/0011714 A1 | 1/2008 | Yokoi et al. | |
| 2008/0070404 A1 | 3/2008 | Beck et al. | |
| 2008/0076688 A1* | 3/2008 | Barnes et al. | 510/175 |
| 2008/0261847 A1* | 10/2008 | Visintin et al. | 510/176 |
| 2009/0186793 A1* | 7/2009 | Phenis et al. | 510/176 |
| 2010/0056409 A1* | 3/2010 | Walker et al. | 510/175 |
| 2010/0104824 A1* | 4/2010 | Phenis et al. | 428/195.1 |
| 2010/0112728 A1 | 5/2010 | Korzenski et al. | |

FOREIGN PATENT DOCUMENTS

| | | |
|---|---|---|
| EP | 1 562 225 A | 8/2005 |
| EP | 1 736 534 A1 | 12/2006 |
| JP | 62-188785 A | 8/1987 |
| JP | 0728254 A | 1/1995 |
| RU | 1 807 077 A1 | 4/1993 |
| WO | WO 03 083920 A | 10/2003 |

OTHER PUBLICATIONS

Notification of Transmittal of the International Search Report dated Jan. 12, 2009 for corresponding PCT/US2008/071485.

Notification of Transmittal of the International Search Report dated Feb. 27, 2009 for corresponding PCT/US2008/072923.

Written opinion of the International Searching Authority dated Feb. 27, 2009 for corresponding PCT/US2008/072923.

Written opinion of the International Searching Authority dated Nov. 25, 2009 for corresponding PCT/US2009/048409.

Notification of Transmittal of the International Search Report dated Nov. 25, 2009 for corresponding PCT/US2009/048409.

Notification of Transmittal of the International Search Report dated May 13, 2011 for corresponding PCT/US2011/027493.

Written opinion of the International Searching Authority dated May 13, 2011 for corresponding PCT/US2011/027493.

Related Provisional U.S. Appl. No. 60/953,804, filed Aug. 3, 2007.

Related Provisional U.S. Appl. No. 60/956,030, filed Aug. 15, 2007.

Related Provisional U.S. Appl. No. 61/075,195, filed Jun. 24, 2008.

Related Provisional U.S. Appl. No. 61/311,516, filed Mar. 8, 2010.

Non-Final Office Action mailed Dec. 15, 2008 for related U.S. Appl. No. 11/260,912.

Non-Final Office Action mailed Jun. 17, 2010 for related U.S. Appl. No. 11/551,826.

Non-Final Office Action mailed Aug. 25, 2011 for related U.S. Appl. No. 11/551,826.

Non-Final Office Action mailed Jul. 19, 2011 for related U.S. Appl. No. 12/637,828.

Non-Final Office Action mailed Apr. 3, 2009 for related U.S. Appl. No. 11/928,754.

Non-Final Office Action mailed Mar. 22, 2010 for related U.S. Appl. No. 12/697,470.

Non-Final Office Action mailed Aug. 17, 2011 for related U.S. Appl. No. 12/490,654.

Notice of Allowance mailed Aug. 28, 2009 for related U.S. Appl. No. 11/260,912.

Notice of Allowance mailed Nov. 17, 2011 for related U.S. Appl. No. 12/637,828.

Notice of Allowance mailed Sep. 30, 2009 for related U.S. Appl. No. 11/928,754.

Notice of Allowance mailed Aug. 23, 2010 for related U.S. Appl. No. 12/697,470.

Related U.S. Appl. No. 11/260,912, filed Oct. 28, 2005.

Related U.S. Appl. No. 11/551,826, filed Oct. 23, 2006.

Related U.S. Appl. No. 12/091,808, filed Oct. 24, 2006.

Related U.S. Appl. No. 12/637,828, filed Dec. 15, 2009.

Related U.S. Appl. No. 11/928,754, filed Oct. 30, 2007.

Related U.S. Appl. No. 12/697,470, filed Feb. 1, 2010.

Related U.S. Appl. No. 11/928,728, filed Oct. 30, 2007.

Related U.S. Appl. No. 12/490,654, filed Jun. 24, 2009.

Related U.S. Appl. No. 13/042,541, filed Mar. 8, 2011.

Related Provisional U.S. Appl. No. 61/557,229, filed Nov. 8, 2011.

* cited by examiner

DYNAMIC MULTI-PURPOSE COMPOSITION FOR THE REMOVAL OF PHOTORESISTS AND METHODS FOR ITS USE

This is application is a continuation-in-part of application Ser. No. 11/260,912, filed on Oct. 28, 2005 now U.S. Pat. No. 7,632,796.

The present disclosure relates generally to compositions having the ability to effectively remove photoresists from substrates and methods for their use. The compositions disclosed are stripper solutions for the removal of photoresists that have the ability to remain liquid at temperatures below normal room temperature and temperatures frequently encountered in transit and warehousing and additionally have advantageous loading capacities for the photoresist materials that are removed. Stripper solutions having reduced water content have proven particularly effective in cleanly removing photoresists, providing low copper etch rates, and increasing the solubility of photoresists in the stripper solution as evidenced by lower particle counts.

SUMMARY

In broad terms, a first aspect of the present disclosure provides for a photoresist stripper solution for effectively removing or stripping a photoresist from a substrate, having particularly high loading capacities for the resist material, and the ability to remain a liquid when subjected to temperatures below normal room temperature that are typically encountered in transit, warehousing and in use in some manufacturing facilities. The compositions according to this present disclosure typically remain liquid to temperatures as low as about −20° C. to about +15° C. The compositions according to the present disclosure typically contain dimethyl sulfoxide (DMSO), a quaternary ammonium hydroxide, and an alkanolamine. One preferred embodiment contains from about 20% to about 90% dimethyl sulfoxide, from about 1% to about 7% of a quaternary ammonium hydroxide, and from about 1% to about 75% of an alkanolamine having at least two carbon atoms, at least one amino substituent and at least one hydroxyl substituent, the amino and hydroxyl substituents attached to two different carbon atoms. The preferred quaternary groups are ($C_1$-$C_8$) alkyl, arylalkyl and combinations thereof. A particularly preferred quaternary ammonium hydroxide is tetramethyammonium hydroxide. Particularly preferred 1,2-alkanolamines include compounds of the formula:

I

where $R^1$ can be H, $C_1$-$C_4$ alkyl, or $C_1$-$C_4$ alkylamino. For particularly preferred alkanol amines of formula I, $R^1$ is H or $CH_2CH_2NH_2$. A further embodiment according to this present disclosure contains an additional or secondary solvent. Preferred secondary solvents include glycols, glycol ethers and the like.

A second aspect of the present disclosure provides for methods of using the novel stripper solutions described above to remove photoresist and related polymeric materials from a substrate. A photoresist can be removed from a selected substrate having a photoresist thereon by contacting the substrate with a stripping solution for a time sufficient to remove the desired amount of photoresist, by removing the substrate from the stripping solution, rinsing the stripping solution from the substrate with a solvent and drying the substrate.

A third aspect of the present disclosure includes electronic devices manufactured by the novel method disclosed.

A fourth aspect of the present disclosure includes preferred stripper solutions containing dimethyl sulfoxide, a quaternary ammonium hydroxide, an alkanolamine, an optional secondary solvent with reduced amounts of water. The preferred solutions have a dryness coefficient of at least about 1 and more preferred solutions having a dryness coefficient of at least about 1.8, where the dryness coefficient (DC) is defined by the following equation:

$$DC = \frac{\text{mass of base/mass of solution tested}}{\text{mass of water/mass of solution tested}}$$

A fifth aspect of the present disclosure includes a method for removing a photoresist from a substrate with the new dry stripper solution. The method involves selecting a substrate having a photoresist deposited on it, contacting the substrate including the photoresist with a stripper solution that contains dimethyl sulfoxide, a quaternary ammonium hydroxide, an alkanolamine, an optional secondary solvent wherein the stripper solution has a dryness coefficient of at least about 1, removing the substrate from contact with the stripper solution and rinsing the stripper solution from the substrate.

A sixth aspect of the present disclosure includes an electronic device prepared in part by the method described above.

A seventh aspect of the present disclosure includes a method for providing a dry composition that includes dimethyl sulfoxide, a quaternary ammonium hydroxide, an alkanolamine, an optional secondary solvent wherein the solution has a dryness coefficient of at least about 1.

An eighth aspect of the present disclosure includes a method for obtaining a quaternary ammonium hydroxide having reduced water content by forming a solution of the quaternary ammonium hydroxide, unwanted water and a sacrificial solvent and subjecting the solution to reduced pressure with slight warming. During the treatment a portion of sacrificial solvent and water are removed. During the process excessive heating should be avoided to prevent decomposition of the hydroxide. The addition and removal of the sacrificial solvent with water can be repeated as necessary until the water content is sufficiently reduced.

A ninth aspect of the present disclosure includes a method for maintaining a low water content for a stripper solution. The method involves selecting a dry stripper solution, establishing contact between the stripper solution and molecular sieves, and maintaining contact with the sieves until the stripper solution is utilized. This method is particularly useful in maintaining the stripper solutions in a dry form following manufacture, during storage and/or shipping and after the solution's container has been opened.

DESCRIPTION

For the purposes of promoting an understanding of what is claimed, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

The compositions according to this present disclosure include dimethyl sulfoxide (DMSO), a quaternary ammonium hydroxide, and an alkanolamine. Preferred alkanol amines having at least two carbon atoms, at least one amino substituent and at least one hydroxyl substituent, the amino and hydroxyl substituents attached to two different carbon atoms. Preferred quaternary substituents include ($C_1$-$C_8$) alkyl, benzyl and combinations thereof. Preferred compositions have a freezing point of less than about −20° C. up to about +15° C. and a loading capacity of from about 15 $cm^3$/liter up to about 90 $cm^3$/liter. For the dry stripper solutions, preferred quaternary substituents include $C_1$-$C_4$ alkyl, arylalkyl or combinations thereof.

Formulations having increased levels of an alkanolamine are particularly noncorrosive to carbon steel are less injurious to typical waste treatments systems and auxiliary equipment than other stripper solutions. Particularly preferred compositions contain 1,2-alkanolamines having the formula:

where $R^1$ is hydrogen, ($C_1$-$C_4$) alkyl, or ($C_1$-$C_4$) alkylamino. Some preferred formulations additionally contain a secondary solvent. Particularly preferred formulations contain from about 2% to about 75% of a secondary solvent. Particularly useful secondary solvents include glycols and their alkyl or aryl ethers described in more detail below. The preferred formulations have freezing points sufficiently below 25° C. to minimize solidification during transportation and warehousing. More preferred formulations have freezing points below about 15° C. Because the preferred stripper solutions remain liquid at low temperatures, the need to liquefy solidified drums of stripper solution received during cold weather or stored in unheated warehouses before the solution can be used is eliminated or minimized. The use of drum heaters to melt solidified stripper solution is time consuming, requires extra handling and can result in incomplete melting and modification of the melted solution's composition.

Additionally, compositions according to the present disclosure display high loading capacities enabling the composition to remove higher levels of photoresists without the precipitation of solids. The loading capacity is defined as the number of $cm^3$ of photoresist or bilayer material that can be removed for each liter of stripper solution before material is re-deposited on the wafer or before residue remains on the wafer. For example, if 20 liters of a stripper solution can remove 300 $cm^3$ of photoresist before either redepositon occurs or residue remains on the wafer, the loading capacity is 300 $cm^3$/20 liters=15 $cm^3$/liter The compositions typically contain about 55% to about 95% solvent, all or most of which is DMSO and from about 2% to about 10% of the quaternary ammonium hydroxide. Preferred quaternary substituents include ($C_1$-$C_8$)alkyl, benzyl and combinations thereof. When used, a secondary solvent typically comprises from about 2% to about 35% of the composition. The stripping formulations can also contain an optional surfactant, typically at levels in the range of about 0.01% to about 3%. Suitable levels of the required alkanolamine can range from about 2% to about 75% of the composition. Because some of the stripper solution's components can be provided as aqueous solutions, the composition can optionally contain small amounts of water. All %'s provided herein are weight percents.

Preferred alkanolamines have at least two carbon atoms and have the amino and hydroxyl substituents on different carbon atoms. Suitable alkanolamines include, but are not limited to, ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropane-1-ol, N-methyl-2-aminopropane-1-ol, N-ethyl-2-aminopropane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-aminooctane-4-ol, 1-aminopropane-2,3-diol, 2-aminopropane-1,3-diol, tris(oxymethyl)aminomethane, 1,2-diaminopropane-3-ol, 1,3-diaminopropane-2-ol, and 2-(2-aminoethoxy)ethanol.

Appropriate glycol ether solvents include, but are not limited to, ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monobenzyl ether, diethylene glycol diethyl ether, triethylene glycol monomethyl ether, triethylene glycol dimethyl ether, polyethylene glycol monomethyl ether, diethylene glycol methyl ethyl ether, triethylene glycol, ethylene glycol monomethyl ether acetate, ethylene glycol monoethyl acetate, propylene glycol monomethyl ether, propylene glycol dimethyl ether, propylene glycol monobutyl ether, dipropyelene glycol monomethyl ether, dipropylene glycol monopropyl ether, dipropylene glycol monoisopropyl ether, dipropylene glycol monobutyl ether, dipropylene glycol dimethyl ether, dipropylene glycol dipropyl ether, dipropylene glycol diisopropyl ether, tripropylene glycol and tripropylene glycol monomethyl ether, 1-methoxy-2-butanol, 2-methoxy-1-butanol, 2-methoxy-2-methyl-2-butanol, 3-methoxy-3-methyl-1-butanol, dioxane, trioxane, 1,1-dimethoxyethane, tetrahydrofuran, crown ethers and the like.

The compositions can also optionally contain one or more corrosion inhibitors. Suitable corrosion inhibitors include, but are not limited to, aromatic hydroxyl compounds such as catechol; alkylcatechols such as methylcatechol, ethylcatechol and t-butylcatechol, phenols and pyrogallol; aromatic triazoles such as benzotriazole; alkylbenzotriazoles; carboxylic acids such as formic acid, acetic acid, propionic acid, butyric acid, isobutyric acid, oxalic acid, malonic acid, succinic acid, glutaric acid, maleic acid, fumaric acid, benzoic acid, phtahlic acid, 1,2,3-benzenetricarboxylic acid, glycolic acid, lactic acid, malic acid, citric acid, acetic anhydride, phthalic anhydride, maleic anhydride, succinic anhydride, salicylic acid, gallic acid, and gallic acid esters such as methyl gallate and propyl gallate; organic salts of carboxyl containing organic containing compounds described above, basic substances such as ethanolamine, trimethylamine, diethylamine and pyridines, such as 2-aminopyridine, and the like, and chelate compounds such as phosphoric acid-based chelate compounds including 1,2-propanediaminetetramethylene phosphonic acid and hydroxyethane phosphonic acid, carboxylic acid-based chelate compounds such as ethylenediaminetetraacetic acid and its sodium and ammonium salts, dihydroxyethylglycine and nitrilotriacetic acid, amine-based chelate compounds such as bipyridine, tetraphenylporphyrin and phenanthroline, and oxime-based chelate compounds such as dimethylglyoxime and diphenylglyoxime. A single corrosion inhibitor may be used or a combination of corrosion inhibitors may be used. Corrosion inhibitors have proven useful at levels ranging from about 1 ppm to about 10%.

Preferred optional surfactants have included fluorosurfactants. One example of a preferred fluorosurfactant is DuPont FSO (fluorinated telomere B monoether with polyethylene glycol (50%), ethylene glycol (25%), 1,4-dioxane (<0.1%), water 25%).

Preferred temperatures of at least 50° C. are preferred for contacting the substrate whereas for a majority of applications, temperatures of from about 50° C. to about 75° C. are more preferred. For particular applications where the substrate is either sensitive or longer removal times are required, lower contacting temperatures are appropriate. For example, when reworking substrates, it may be appropriate to maintain the stripper solution at a temperature of at least 20° C. for a longer time to remove the photoresist and avoid damaging to the substrate. If longer contact times are required for complete resist removal, placing a blanket of dry nitrogen over the stripper solution can reduce water uptake from the atmosphere and maintain the dry stripper solution's improved performance.

When immersing a substrate, agitation of the composition additionally facilitates photoresist removal. Agitation can be effected by mechanical stirring, circulating, or by bubbling an inert gas through the composition. Upon removal of the desired amount of photoresist, the substrate is removed from contact with the stripper solution and rinsed with water or an alcohol. DI water is a preferred form of water and isopropanol is a preferred alcohol. For substrates having components subject to oxidation, rinsing is preferably done under an inert atmosphere. The preferred stripper solutions according to the present disclosure have improved loading capacities for photoresist materials compared to current commercial products and are able to process a larger number of substrates with a given volume of stripper solution.

The stripper solutions provided in this disclosure can be used to remove polymeric resist materials present in a single layer or certain types of bilayer resists. For example, bilayer resists typically have either a first inorganic layer covered by a second polymeric layer or can have two polymeric layers. Utilizing the methods taught below, a single layer of polymeric resist can be effectively removed from a standard wafer having a single polymer layer. The same methods can also be used to remove a single polymer layer from a wafer having a bilayer composed of a first inorganic layer and a second or outer polymer layer. Finally, two polymer layers can be effectively removed from a wafer having a bilayer composed of two polymeric layers. The new dry stripper solutions can be used to remove one, two or more resist layers.

The preferred dry stripper solutions contain dimethyl sulfoxide, a quaternary ammonium hydroxide, an alkanolamine, an optional secondary solvent and less than about 3 wt. % of water. Preferred secondary solvents are glycol ethers. More preferred dry stripper solutions contain dimethyl sulfoxide, a quaternary ammonium hydroxide, an alkanolamine, a glycol ether solvent and a dryness coefficient of at least about 1.8

Use of the dry photoresist stripper solution is similar to that described above for stripper solutions having a low freezing point. However, it is helpful to maintain the stripper solution in a dry form prior to use and to minimize water uptake during its use by maintaining a generally dry environment in the area involved with resist removal. Stripper solutions can be maintained in a dry state by maintaining contact between the stripper solution and active molecular sieves during storage, transit and after opening a container prior to its use.

The dry stripper solutions described herein should be prepared from dry components to the extent possible. Because quaternary ammonium hydroxides are hygroscopic and are generally available as aqueous solutions or their hydrates, water contained in the solution or associated with the hydrate must generally be removed to provide a dry stripper solution having a dryness coefficient of at least about 1. Efforts to dry quaternary ammonium hydroxides at elevated temperatures and to a dry state generally results in decomposition of the hydroxide. It has surprisingly been found that quaternary ammonium hydroxides in a volatile solvent can be pre-dried to give a solvent wet paste having reduced water content without decomposition. A dry stripper solution containing a quaternary ammonium hydroxide can be prepared by pre-drying the quaternary ammonium hydroxide and combining it with other substantially dry components to maintain a low water content or by subsequently drying an initially formed wet stripper solution formed from water-containing components.

A pre-dried form of a quaternary ammonium hydroxide can be obtained by subjecting a hydrated or otherwise wet form of a quaternary ammonium hydroxide to a reduced pressure with very slight warming. Water removal may be facilitated by dissolving the quaternary ammonium hydroxide in a solvent such as an alcohol prior to subjecting the hydroxide to reduced pressure. Based on work carried out thus far, a preferred alcohol is methanol. During this treatment a substantial portion of the water and alcohol are removed to provide an alcohol wet paste of the quaternary ammonium hydroxide. Depending on the level of dryness desired, additional dry alcohol can be added to the initially treated hydroxide and the treatment at reduced pressure repeated one or more times. Treatments can be carried out at pressures of from about 0.001 to about 30 mmhg and at temperatures of up to at least about 35° C. without substantial decomposition of the quaternary ammonium hydroxide. More preferred treatments can be carried out at pressures of from about 0.01 to about 10 mmhg.

For wet formulations with or without a secondary solvent, drying can be carried out on the stripper solution after the addition of all components by contacting the stripper solution with a solid drying agent, such as for example, molecular sieves, calcium hydride, calcium sulfate or a combination of drying agents. A preferred drying agent is an activated 3A or 4A molecular sieve. For dry stripper solutions containing a secondary solvent, it is preferred to combine the quaternary ammonium hydroxide (and any other wet components), contact the resulting solution with an active drying agent such as molecular sieves, separate the dry solution from the spent drying agent and add any remaining dry components to the dry solution. Contact with the molecular sieves or other solid drying agent can be by any known method, such as slurrying the solution with drying agent and filtering the dry slurry. Similarly, any of the wet solutions described above can be dried by passing the wet solution through pelletized activated molecular sieves or other drying agent in a column. Suitable molecular sieves include type 3A, 4A and 5A sieves.

Molecular sieves are also a preferred drying agent or desiccant to maintain the stripper solution in a dry state. The pellet form is most preferred because it allows removal of the dry stripper solution by simple decantation. However, for applications in which decantation does not provide an adequate separation, molecular sieve, whether powder or pellets can be incorporated into a "tea bag" arrangement that will allow equilibrium with the solution, but not allow any sieve particles to contaminate the solution. Dry stripper solutions containing molecular sieves can be maintained in a dry state for extended periods of time after a container has been opened, depending on the amount of molecular sieves included with the stripper solution, the surrounding humidity and the amount of time the container is open.

EXAMPLES 1-13

The reactants listed in Table I were separately combined with stirring to give each of the 13 homogeneous stripper solutions. The freezing points were determined and are also provided in Table I. The compositions of Examples 1-13 can optionally be formulated without a surfactant and formulated to include a corrosion inhibitor.

TABLE I

| Example | Formulation* | Freezing Point, °C. | Dryness Coefficient |
|---|---|---|---|
| 1 | 85.8 g DMSO (85.8%)<br>6.0 g Diethyleneglycol monomethyl ether (6.0%)<br>2.7 g Aminoethylethanolamine (2.7%)<br>2.75 g Tetramethylammonium hydroxide (2.75%)<br>2.75 g water (2.75%) | +13.2 | 1 |
| 2 | 61 g DMSO (61%)<br>35 g Monoethanolamine (35%)<br>2 g Tetramethylammonium hydroxide (2%)<br>2 g water (2%) | −2.5 | 1 |
| 3 | 51.5 g DMSO (51.5%)<br>35 g Diethylene glycol monomethyl ether (35%)<br>11.3 g Aminoethylethanolamine (11.3%)<br>1.1. g Tetramethylammonium hydroxide (1.1%)<br>1.1 g water (1.1%) | −7.4 | 1 |
| 4 | 71 g DMSO (71%)<br>27.4 g Monoethanolamine (27.4%)<br>0.8 g Tetramethylammonium hydroxide (0.8%)<br>0.8 g water (0.8%) | +5.3 | 1 |
| 5 | 27.4 g DMSO (27.4%)<br>71 g Monoethanolamine (71%)<br>0.8 g Tetramethylammonium hydroxide (0.8%)<br>0.8 g water (0.8%) | +0.4 | 1 |
| 6 | 86 g DMSO (86.4%)<br>6 g Diethylene glycol monomethyl ether (6%)<br>2.7 g Aminoethylethanolamine (2.7%)<br>2 g Benzyltrimethylammonium hydroxide (2%)<br>3 g water (3%) | +7.7 | 0.7 |
| 7 | 86 g DMSO (82.1%)<br>6 g Diethylene glycol monomethyl ether (5.7%)<br>2.7 g Aminoethylethanolamine (2.6%)<br>2 g Diethyldimethylammonium hydroxide (1.9%)<br>8 g water (7.7%) | −4.6 | 0.25 |
| 8 | 86 g DMSO (82.1%)<br>6 g Diethylene glycol monomethyl ether (5.7%)<br>2.7 Aminoethylethanolamine (2.6%)<br>2 g Methyltriethylammonium hydroxide (1.9%)<br>8 g water (7.7%) | −5.5 | 0.25 |
| 9 | 86 g DMSO (87.5%)<br>6 g Diethylene glycol monomethyl ether (6.1%)<br>2.7 g Aminoethylethanolamine (2.8%)<br>1.6 g Tetrabutylammonium hydroxide (1.6%)<br>2 g water (2%) | +8.4 | 0.8 |
| 10 | 63 g DMSO (61.2%)<br>35 g Monoethanolamine (34%)<br>2 g Benzyltrimethylammonium hydroxide (1.9%)<br>3 g water (2.9%) | −6.3 | 0.7 |
| 11 | 63 g DMSO (58.3%)<br>35 g Monoethanolamine (32.4%)<br>2 g Diethyldimethylammonium hydroxide (1.9%)<br>8 g water (7.4%) | <−20 | 0.25 |
| 12 | 63 g DMSO (58.3%)<br>35 g Monoethanolamine (32.4%)<br>2 g Methyltriethylammonium hydroxide (1.9%)<br>8 g water (7.4%) | <−20 | 0.25 |
| 13 | 63 g DMSO (62.0%)<br>35 g Monoethanolamine (34.4%)<br>1.6 g Tetrabutylammonium hydroxide (1.6%)<br>2 g water (2%) | −6.2 | 0.8 |

*Each formulation additionally contained an optional 0.03 g of DuPont FSO (fluorinated telomere B monoether with polyethylene glycol (50%), ethylene glycol (25%), 1,4-dioxane (<0.1%), water 25%)

EXAMPLE 14

A silicon wafer having a photoresist thereon is immersed in the stripping solution from Example 1, maintained at a temperature of about 70° C. with stirring for from about 30 to about 60 minutes. The wafer is removed, rinsed with DI water and dried. Examination of the wafer will demonstrate removal of substantially all of the photoresist. For some applications, superior results may be obtained by immersing the wafer in the stripping solution without stirring and/or immersing the wafer for up to 150 minutes. The preferred manner of removing the photoresist from a wafer can readily be determined without undue experimentation. This method can be used to remove a single layer of polymeric photoresist or two polymeric layers present in bilayer resists having two polymer layers.

EXAMPLE 15

A silicon wafer having a photoresist thereon is mounted in a standard spray device and sprayed with the stripper solution from Example 2, maintained at about 50° C. The spraying can optionally be carried out under an inert atmosphere or optionally in the presence of an active gas such as, for example, oxygen, fluorine or silane. The wafer can be removed periodically and inspected to determine when sufficient photoresist has been removed. When sufficient photoresist has been removed, the wafer can be rinsed with isopropanol and dried. This method can be used to remove a single layer of polymeric photoresist or two polymeric layers present in bilayer resists having two polymer layers.

The methods described in Examples 14 and 15 can be used with the stripper solutions of this disclosure to remove photoresists from wafers constructed of a variety of materials, including GaAs. Additionally, both positive and negative resists can be removed by both of these methods.

The methods described in Examples 14, 15 and 16 can similarly be used with the dry stripper solution described herein.

EXAMPLE 16

The method described in Example 14 was used to remove photoresist from the wafers described below in Table II. Twenty liter volumes of three stripper solutions were used until either a residue of photoresist polymer remained on the wafer or until re-deposition of the polymer or its degradation products onto the wafer occurred, at which point the solutions loading capacity was reached. With this method the loading capacity was determined for the two stripper solutions described in Examples 1 and 2 above and for a comparative example that is generally typical of current commercial stripper solutions.

TABLE II

| Stripping Formulation | Composition | Wafers Stripped with 20 L of Stripper Solution | Resist Loading Capacity $cm^3/L$ |
|---|---|---|---|
| From Example 1 | 85.5 g DMSO<br>6 g Diethylene glycol monomethyl ether<br>2.7 g Aminoethylethanolamine<br>2.75 g Tetramethylammonium hydroxide<br>2.75 g water<br>0.03 g DuPont FSO surfactant | 150 × 200 mm wafers with 80 μm photoresist | 18.8 |
| From Example 2 | 61 g DMSO<br>35 g Monoethanolamine<br>2 g Tetramethylammonium hydroxide<br>2 g water<br>0.03 g DuPont FSO surfactant | 200 × 300 mm wafers with 120 μm photoresist | 84.8 |
| Comparative Example | 74 g n-methylpyrrolidone<br>24 g 1,2-propanediol<br>1 g Tetramethylammonium hydroxide<br>1 g water | 25 × 300 mm wafers with 120 μm photoresist | 10.6 |

EXAMPLE 17

Dimethylsulfoxide (85.5 g), diethyleneglycol monomethyl ether (6.0 g), aminoethylethanolamine (2.7 g) and tetramethylammonium hydroxide pentahydrate (5.5 g) were combined to provide a stripper solution containing about 3 wt. % water and a dryness coefficient of about 0.9. Dissolution of the hydroxide pentahydrate was facilitated by slightly agitating the mixture. The about 3 wt. % water in the solution came substantially from the pentahydrate.

EXAMPLE 18

Active 3A molecular sieves were added to three different samples of the stripper solution prepared according to the method of Example 17 and maintained in contact with the stripper solutions for 72 hours at ambient temperature. The sieves were removed by filtration and the moisture content of the initial and dried solutions determined by the Karl Fischer method. The dried stripper solutions were stored in closed container. The spent sieves could be dried for reuse or disposed of. The specific details for this experiment are tabulated below in Table III.

TABLE III

| Example | Stripper Solution (g) | Sieves (g) | % Water Remaining | Dryness Coefficient |
|---|---|---|---|---|
| 18 (a) | 11.4 | 15.16 | 2.37 | 1.13 |
| 18 (b) | 126.4 | 25 | 1.36 | 1.99 |
| 18 (c) | 135.48 | 45.25 | 0.78 | 3.46 |

Varying amounts of calcium hydride, as well as other solid desiccants can be substituted for molecular sieves in this example to provide stripper solutions having similarly reduced levels of water.

EXAMPLE 19

Three silicon wafers having a negative acrylate polymer-based dry film photoresist (120 μm) placed thereon over a copper region were separately immersed in the three dried stripper solutions prepared in Example 18 and maintained at 70° C. for 60 minutes. The samples were removed and rinsed with deionized water for one minute. The resulting stripper solutions were analyzed for the number of particles of photoresist suspended therein utilizing a LiQuilaz SO5 particle analyzer and the copper etch rate determined for each wafer. The results are tabulated in Table IV provided below. LiQuilaz is a registered trademark of Particle Measuring Systems, Inc., 5475 Airport Blvd., Boulder, Colo., 80301.

TABLE IV

| Stripper Solution Source | Stripper Solution (g) | Number of Suspended Particles | Mass of Removed Photoresist (g) | Particles/g photoresist removed/g solution | Copper Etch Rate Å/minute |
|---|---|---|---|---|---|
| 18 (a) | 114.5 | 12444.4 | 0.2428 | 447.63 | <1.0 |
| 18 (b) | 126.4 | 9088.4 | 0.2914 | 246.74 | <1.0 |
| 18 (c) | 135.8 | 186.8 | 0.2523 | 5.46 | <1.0 |

Photoresist removal as described above can be carried out at temperatures ranging from about 70° C. to about 80° C. without taking any measures to exclude moisture. However, when photoresist removal is carried out at lower temperatures, of less than about 70° C., it may be helpful to take measures to minimize the uptake of moisture from the atmosphere. Providing a blanket of dry nitrogen over the stripper solution maintained at less than about 70° C. has proven effective to minimize water uptake by the stripper solution with longer exposures to a moist atmosphere. The ability of the dry stripper solutions described above to dissolve larger amounts of photoresists and minimize the number of particles dispersed in the stripper solutions extends the stripper solutions effective lifetime and reduces overall costs.

EXAMPLE 20

A 25 wt % solution of tetramethylammonium hydroxide pentahydrate in methanol was prepared and 40.8 grams of the solution was warmed to about 30° C. in a water bath and maintained at a pressure of about 0.01 mmhg for about 75 minutes. Condensate was collected in a Dewar flask cooled with liquid nitrogen. After about 75 minutes, the temperature of the water bath was raised to about 35° C. and maintained at that temperature for an additional 105 minutes. A white paste resulted. The vacuum was broken and 85.8 g of dry DMSO was added to dissolve the white solid after which were added 6.0 g of diethyleneglycol monomethyl ether and 2.7 g of aminoethylethanolamine to provide a substantially dry version of the stripper solution described in Example 1, Table I. The dry stripper solution's water content was found to be 0.71% by the Karl Fischer method and the solution contained less than 1% methanol. Lower levels of water can be obtained by adding additional methanol to the white paste and maintaining the resulting solution at reduced pressure for an additional 2 to 5 hours.

EXAMPLE 21

Appropriate quantities of dry stripper solutions of the type described in Example 18 are packaged with active molecular sieves to maintain the stripper solutions in a dry condition for longer periods of time. About 5 to about 10 grams of active sieves are added for each 100 g of stripper solution maintained in a closed and sealed container. Molecular sieves in the form of pellets are preferred. However, powdered sieves can be used if removed by filtration prior to use or if small amounts of particulate matter do not interfere with use of the dry stripper solution.

While applicant's disclosure has been provided with reference to specific embodiments above, it will be understood that modifications and alterations in the embodiments disclosed may be made by those practiced in the art without departing from the spirit and scope of the invention. All such modifications and alterations are intended to be covered.

What is claimed is:

1. A stripper solution for removing a photoresist from a substrate comprising dimethyl sulfoxide, tetramethylammonium hydroxide, water, and an alkanolamine, said stripper solution having a dryness coefficient of at least 1 wherein said dryness coefficient (DC) is defined by the equation:

$$DC = \frac{\text{mass of tetramethylammonium hydroxide}}{\text{mass of water}}.$$

2. The solution of claim 1 wherein said alkanolamine is monoethanolamine.

3. The solution of claim 1, additionally comprising a secondary solvent.

4. The solution of claim 3, wherein said secondary solvent is a glycol ether.

5. The solution of claim 4, wherein said glycol ether is diethylene glycol monomethyl ether.

6. The solution of claim 1, wherein the alkanolamine is:

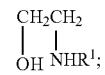

where $R^1$ is H, $C_1$-$C_4$ alkyl, or $C_1$-$C_4$ alkylamino.

7. The solution of claim 6, wherein $R^1$ is $CH_2CH_2NH_2$.

8. The solution of claim 7, having a dryness coefficient of at least about 1.8.

9. A method for removing a photoresist from a substrate comprising:
   (a) selecting a substrate having a photoresist thereon;
   (b) providing a stripper solution; wherein said stripper solution is a stripper solution according to claim 1;
   (c) contacting the substrate with said stripper solution for a time sufficient to remove a desired amount of photoresist;
   (d) removing the substrate from said stripper solution; and
   (e) rinsing the stripper solution from the substrate with a solvent.

10. The method of claim 9 wherein said contacting comprises contacting said substrate with a stripper solution according to claim 1 wherein said alkanolamine is monoethanolamine.

11. The method of claim 9 wherein said contacting comprises contacting said substrate with a stripper solution further comprising a secondary solvent.

12. The method of claim 11, wherein said contacting comprises contacting said substrate with a stripper solution having a dryness coefficient of at least about 1.8.

13. The method of claim 11, wherein said contacting comprises contacting said substrate with a stripper solution maintained at a temperature of at least about 20° C. during the contacting.

14. The method of claim 11, wherein said contacting comprises contacting said substrate with a stripper solution according to claim 1 wherein said alkanolamine is of the formula:

where $R^1$ is H, $C_1$-$C_4$ alkyl, or $C_1$-$C_4$ alkylamino.

15. The method of claim 14, wherein said contacting comprises contacting said substrate with a stripper solution wherein said secondary solvent is a glycol ether.

16. The method of claim 15 wherein said contacting comprises contacting said substrate with said stripper solution having said glycol ether that is diethylene glycol monomethyl ether.

17. The method of claim 16, wherein said photoresist is a bilayer resist having one inorganic layer and one polymer layer.

18. The method of claim 16, wherein said photoresist is a bilayer resist having two polymer layers.

19. The method of claim 16, wherein said contacting comprises contacting said substrate with a stripper solution having said alkanolamine wherein said $R^1$ is $CH_2CH_2NH_2$.

20. The method of claim 16, wherein said contacting comprises contacting said substrate with a stripper solution having said alkanolamine wherein said $R^1$ is hydrogen.

* * * * *